United States Patent [19]

Ozawa et al.

[11] 4,180,750
[45] Dec. 25, 1979

[54] TRANSISTOR SWITCHING CIRCUIT WITH SHORTENED RESPONSE TIME

[75] Inventors: Akio Ozawa; Masaharu Sakamoto; Hideo Ito, all of Tokyo, Japan

[73] Assignee: Pioneer Electronic Corporation, Tokyo, Japan

[21] Appl. No.: 886,701

[22] Filed: Mar. 15, 1978

[30] Foreign Application Priority Data

Mar. 15, 1977 [JP] Japan ............................ 52-13017[U]

[51] Int. Cl.² .......................................... H03K 5/153
[52] U.S. Cl. .................................. 307/362; 307/246; 307/294
[58] Field of Search ............... 307/293, 294, 362, 246, 307/253, 254, 255

[56] References Cited

U.S. PATENT DOCUMENTS 3,649,846  3/1972  Frederiksen .................... 307/362

Primary Examiner—John Zazworsky
Attorney, Agent, or Firm—Sughrue, Rothwell, Mion, Zinn and Macpeak

[57] ABSTRACT

The response time of an ordinary or differential transistor switching circuit controlled by the charging of a capacitor $C_1$ is shortened by charging the capacitor through a constant current source comprising a transistor $Q_6$, a resistor $R_1$ and diodes $D_1$, $D_2$, to thereby provide a sharp transfer characteristic. The charging time may be even further shortened by increasing the constant current supply at an intermediate threshold level using a further ordinary or differential transistor switching circuit, thereby providing a break in the response characteristic and increasing its slope after the threshold point.

5 Claims, 9 Drawing Figures

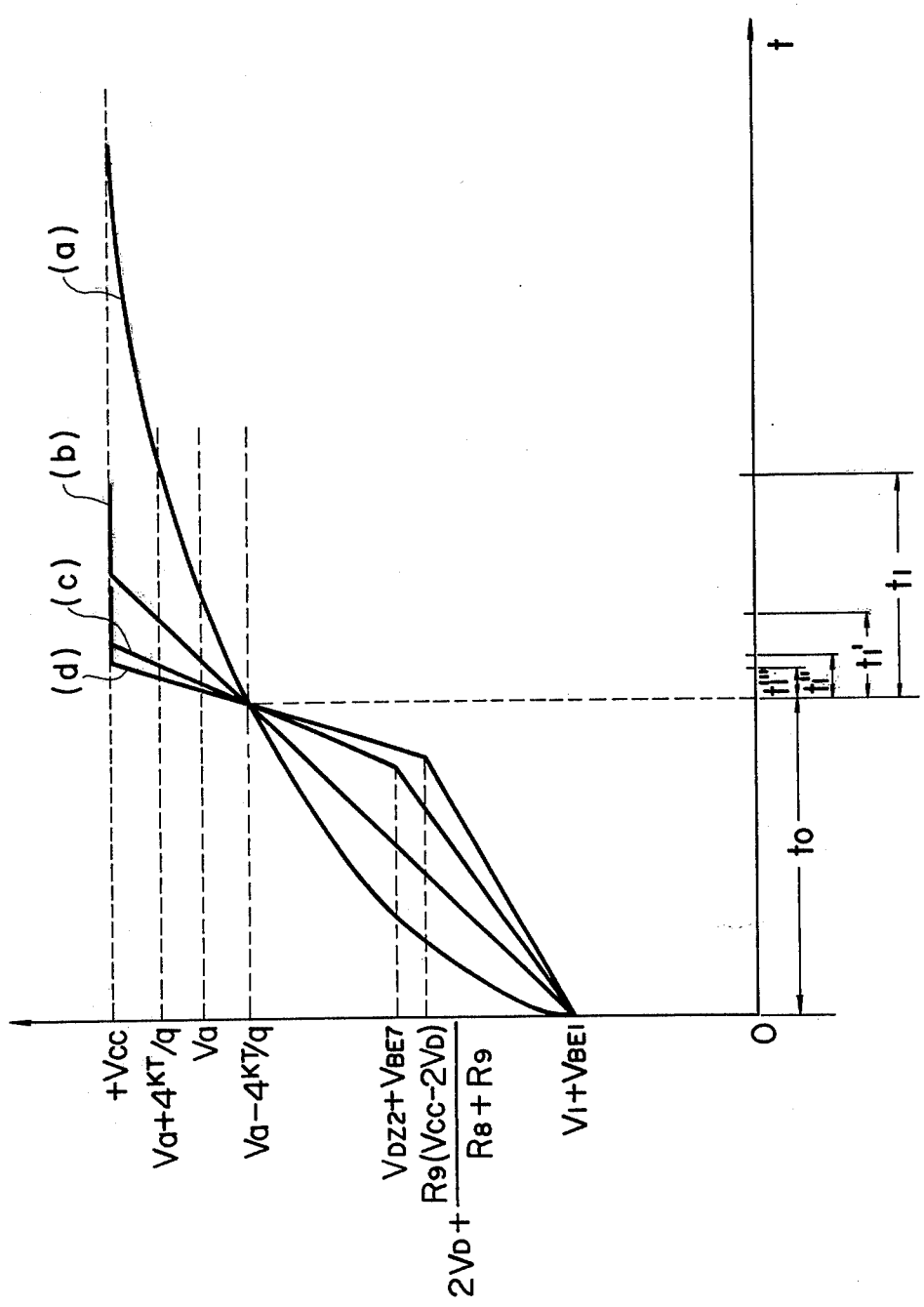

TRANSISTOR SWITCHING CIRCUIT WITH SHORTENED RESPONSE TIME

BACKGROUND OF THE INVENTION

This invention relates to a switching circuit having a shortened response time determined by the charging rate of a capacitor.

A conventional differential switching circuit employed in a muting circuit, a noise eliminating circuit, or the like in a radio receiver is shown in FIG. 1. When a passage control signal is applied over line 2 to a switching circuit 1, an input signal applied to the input terminal IN is passed through to the output terminal OUT. In contrast, when an interruption signal is applied over line 3, a signal applied to terminal IN is interrupted or blocked by the switching circuit 1, and not delivered to terminal OUT.

If the resistances of biasing resistors $R_3$ and $R_4$ are selected so that when no voltage is applied to a switching terminal (C) at the base of transistor $Q_1$, the potential at a point (B) is higher by at least $4 KT/q$ (where K is the Boltzman constant, T is the absolute temperature, and q is the electron charge) than the potential at point (A), then transistor $Q_2$ is rendered conductive while transistor $Q_3$ is rendered non-conductive. Accordingly, only the passage control signal on line 2 is provided, and a signal applied to the input terminal IN is passed through to the output terminal OUT. When a voltage $V_1$ is applied to the switching terminal (C), point (B) has a potential $(V_1 + V_{BE1})$ where $V_{BE1}$ is the base-emitter voltage of transistor $Q_1$. If the value of $V_1$ is set so that the potential Va at point (A) is higher by at least $4 KT/q$ than the potential at point (B), then transistor $Q_3$ is rendered conductive, while transistor $Q_2$ is cut off. Accordingly, an interruption control signal is provided on line 3, and the input signal is blocked in the switching circuit 1.

When the application of voltage $V_1$ to the switching terminal (C) is suspended, the potential at point (B) builds up to the supply voltage $+Vcc$ after a time period determined by the values of resistor $R_1$ and capacitor $C_1$. If the time interval during which the potential at point (B) changes from $(V_1 + V_{BE1})$ to $(Va - 4 KT/q)$ is represented by $t_0$, then transistors $Q_3$ and $Q_2$ are maintained conductive and non-conductive, respectively, during the time $t_0$, and accordingly the interruption control signal remains on line 3 during such time. If the time interval during which the potential at point (B) changes from $(Va - 4 KT/q)$ to $(Va + 4 KT/q)$ is referred to as the differential switching period and is represented by $t_1$, then collector currents $I_{C1}$ and $I_{C2}$ simultaneously flow in the transistors $Q_2$ and $Q_3$, respectively, during such time because it falls in a linear region as shown in FIGS. 2 and 3. After time $t_1$ transistor $Q_2$ is rendered conductive while transistor $Q_3$ is cut off, whereby only the passage control signal appears on line 2.

As is apparent from the above description, a problem exists during the differential switching period $t_1$ because during such time both the passage control and interruption control signals are generated, which leads to the erroneous operation of the switching circuit 1.

An ordinary transistor switching circuit employing a conventional capacitor charging circuit is shown in FIG. 4. The breakdown voltage of the Zener diode $D_{Z1}$ is represented by $V_{DZ1}$, and the base-emitter voltage of transistor $Q_5$ is represented by $V_{BE5}$. Upon the closure of switch $SW_1$, the potential at point (B) is increased to $(V_{DZ1} + V_{BE5})$ over a time period determined by the values of resistor $R_1$ and capacitor $C_1$. When the potential at point (B) exceeds $V_{DZ1}$, current begins to flow in transistor $Q_5$ and the potential at terminal (D) begins to drop. When the potential at point (B) reaches $(V_{DZ1} + V_{BE5})$ transistor $Q_5$ is rendered fully conductive, whereby the voltage at terminal (D) is substantially equal to the breakdown voltage $V_{DZ1}$ of the Zener diode $D_{Z1}$. The output voltage at terminal (D) does not have a steep drop, however, because of the relatively slow build up characteristic of the potential at point (B), which leads to a reduction of the switching speed.

SUMMARY OF THE INVENTION

Briefly, and in accordance with the present invention, the response time of an ordinary or differential transistor switching circuit controlled by the charging of a capacitor is shortened by charging the capacitor through a constant current source to thereby provide a sharp transfer characteristic. The charging time may be even further shortened by increasing the constant current supply at an intermediate threshold level using a further ordinary or differential transistor switching circuit, thereby providing a break in the response characteristic and increasing its slope after the threshold point.

BRIEF DESCRIPTION OF THE DRAWINGS

In the drawings:

FIG. 9 shows a comparative plot of the response curves for a conventional switching circuit and the switching circuits according to this invention.

DETAILED DESCRIPTION OF THE PREFERRED EMBODIMENTS

Figure 1:
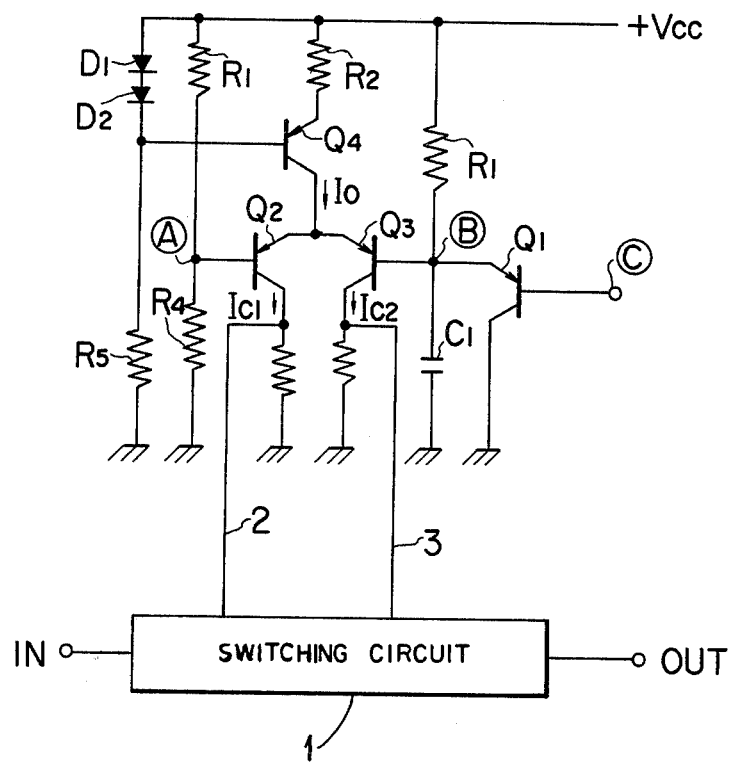
FIG. 1 shows a schematic diagram of a conventional differential switching circuit.
Figure 2:
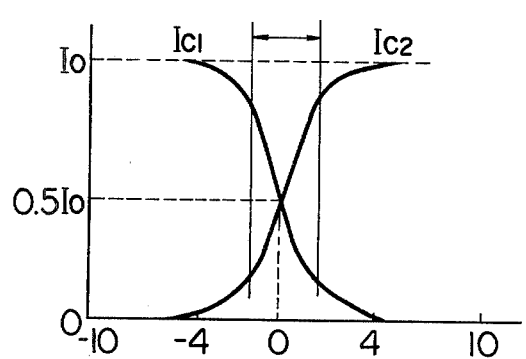
FIG. 2 shows a plot of the cross-over characteristics of the differential amplifier included in FIG. 1.
Figure 3:
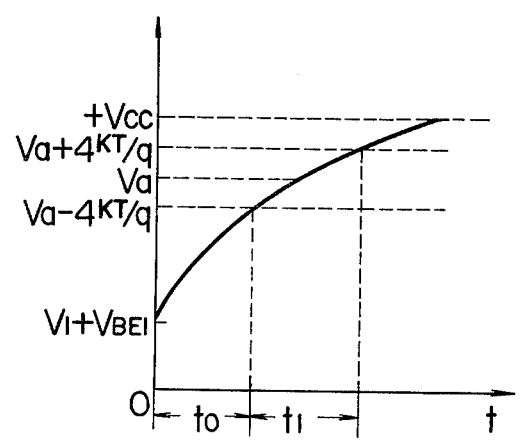
FIG. 3 shows a plot of the response time of the circuit shown in FIG. 1.
Figure 6:
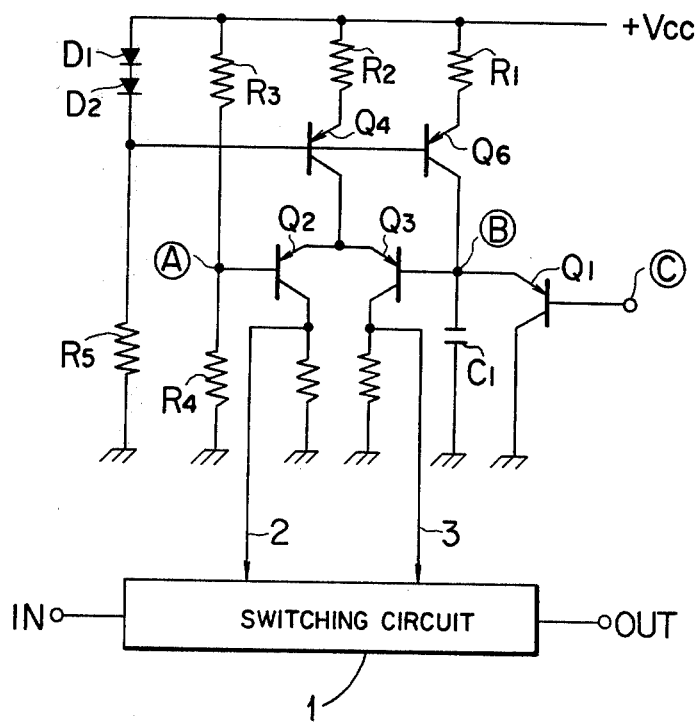

FIG. 6 shows a first embodiment of this invention, in which those components already described with reference to FIG. 1 have been similarly numbered. In addition, however, a transistor $Q_6$ is connected in series with the capacitor $C_1$, and the resistor $R_1$ is connected between the emitter of $Q_6$ and the supply voltage $+Vcc$. The base of $Q_6$ is connected to the junction between diodes $D_1$ and $D_2$ and resistor $R_5$. In this circuit a constant current source for capacitor $C_1$ is constituted by transistor $Q_6$, resistor $R_1$, and diodes $D_1$ and $D_2$ which serve as a biasing source. When the signal applied to switching terminal (C) is suspended, capacitor $C_1$ is charged by the constant current source, and the potential at point B accordingly builds up to the supply voltage $+Vcc$ at a constant rate as indicated by curve (b) in FIG. 9. The differential switching time is thus reduced from $t_1$ to $t_1'$ (curve (a) in FIG. 9 corresponds to the conventional circuit response curve shown in FIG. 3).

Figure 7:
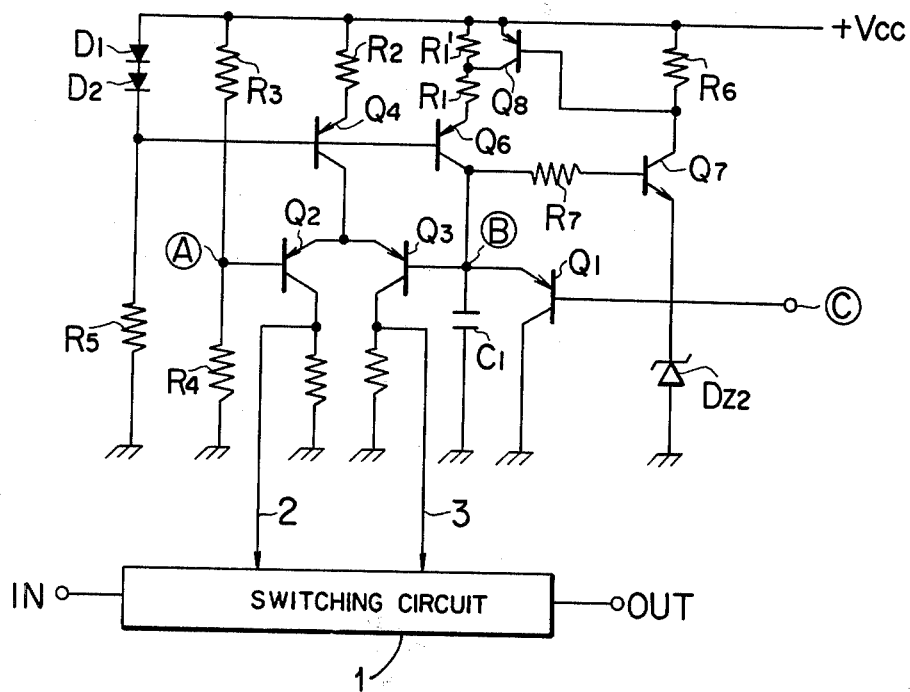

A second embodiment is shown in FIG. 7, in which the constant current source comprises transistor $Q_6$, resistors $R_1$ and $R_1'$, and diodes $D_1$ $D_2$. The base of transistor $Q_7$ is connected through resistor $R_7$ to terminal (B), the emitter of $Q_7$ is grounded through a reverse biased Zener diode $D_{Z2}$, and the collector is connected through resistor $R_6$ to the supply voltage $+V_{cc}$. The emitter and collector of transistor $Q_8$ are connected across resistor $R_1$, and the base of $Q_8$ is connected to the junction between $R_6$ and the collector of $Q_7$. When the signal applied to switching terminal (C) is suspended, capacitor $C_1$ is charged by the constant current source, and the potential at point (B) is thus built up at a constant rate. Furthermore, if the breakdown voltage of the Zener diode $D_{Z2}$ is represented by $V_{DZ2}$ and the base-emitter voltage of $Q_7$ is represented by $V_{BE7}$, when the potential at point (B) reaches $(V_{DZ2}+V_{BE7})$ transistor $Q_7$ is rendered conductive. A voltage drop thus occurs across $R_6$, the base potential of $Q_8$ is lowered, and transistor $Q_8$ is therefore rendered conductive. Accordingly, the emitter resistance of $Q_6$ drops to substantially only the value of $R_1$, the current supplied by the constant current source is increased, and the charging rate is correspondingly increased. The potential at point (B) thus follows the bent line (c) in FIG. 9, which has a break at $(V_{DZ2}+V_{BE7})$. If transistor $Q_8$ is rendered conductive before the differential switching voltage $V_a \pm 4KT/q$ is reached, the differential switching time is thus reduced from $t_1$ to $t_1''$.

Figure 8:
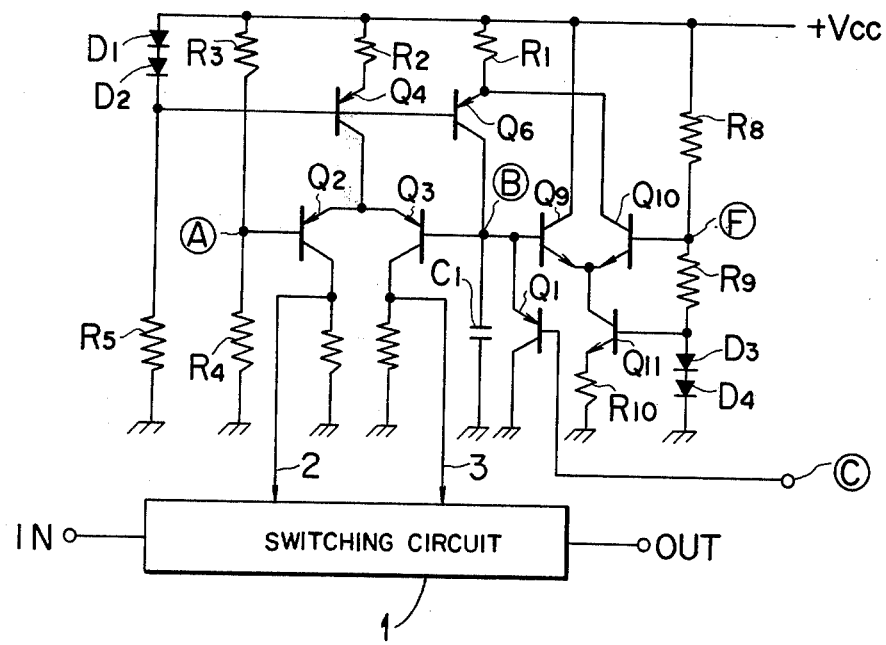

The third embodiment shown in FIG. 8 comprises transistors $Q_9$ and $Q_{10}$ connected in a differential mode, the collector of $Q_9$ being connected to the supply voltage $+V_{cc}$ and the collector of $Q_{10}$ being connected to the junction between the emitter of $Q_6$ and resistor $R_1$. A transistor $Q_{11}$, a resistor $R_{10}$ and diodes $D_3$ and $D_4$ form a constant current source for the differentially connected transistors $Q_9$ and $Q_{10}$. The resistances of resistors $R_8$ and $R_9$ are selected so that when no voltage is applied to switching terminal (C), the potential at point (F) at the base of $Q_{10}$ is higher than that at point (B) at the base of $Q_9$. When the signal applied to switching terminal (C) is suspended, transistor $Q_{10}$ is thus rendered conductive and the charging current for capacitor $C_1$ from the constant current source is divided into two components which are respectively applied to transistors $Q_6$ and $Q_{10}$. In other words, a current determined by transistor $Q_6$, diodes $D_1$ and $D_2$ and resistor $R_1$ flows through $R_1$. From this a current determined by transistor $Q_{11}$, resistor $R_{10}$ and diodes $D_3$ and $D_4$ flows through transistor $Q_{10}$, while the remaining current flows through $Q_6$ to charge capacitor $C_1$ and thus increase the potential at point (B). When the latter becomes higher by at least $4 KT/q$ than the value of the potential at point (F) given by $2V_D+[R_9(V_{cc}-2V_D)/(R_8+R_9)]$, where $V_D$ is the forward voltage of diodes $D_3$ and $D_4$, transistor $Q_{10}$ is cut off while transistor $Q_9$ is rendered conductive. When $Q_{10}$ is cut off all of the current flowing through resistor $R_1$ goes to charge capacitor $C_1$, thus increasing the charging rate. If transistor $Q_{10}$ is cut off before the differential switching voltage $V_a \pm 4 KT/q$ is reached, the differential switching time is thus shortened from $t_1$ to $t_1'''$ as indicated by curve (d) in FIG. 9.

All of the switching circuit elements except for the charging capacitor $C_1$ can conveniently be formed as an integrated circuit at low cost, and the differential switching period can be varied by independently selecting the value of $C_1$.

Figure 4:
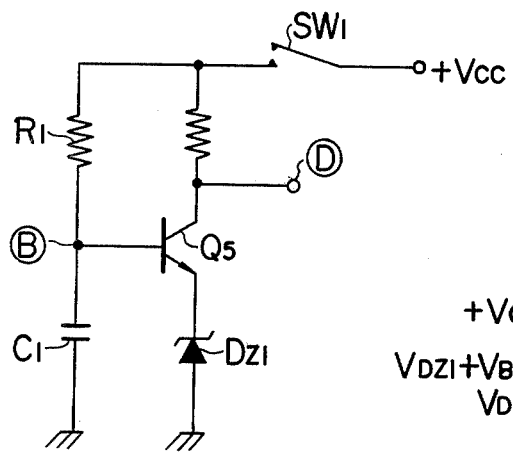
FIG. 4 shows a schematic diagram of a conventional ordinary transistor switching circuit.
Figure 5:
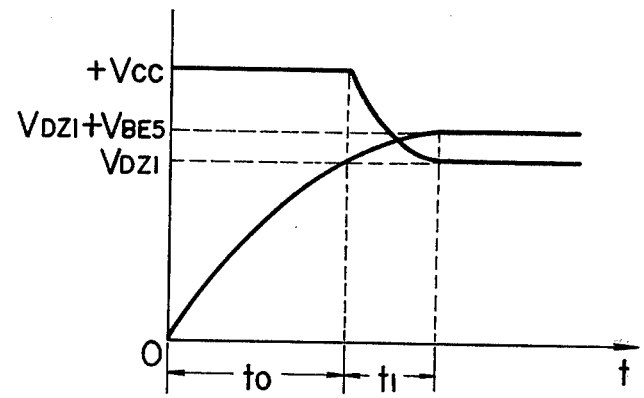
FIG. 5 shows a plot of the response time of the circuit shown in FIG. 4, FIGS. 6, 7 and 8 show schematic diagrams of various swithcing circuit embodiments according to the present invention.

Although this invention has been described with reference to a differential switching circuit, it is obvious that the technical concept thereof can equally be applied to an ordinary transistor switching circuit shown in FIG. 4.

What is claimed is:

1. In a transistor switching circuit including first switching means comprising at least one switching transistor, a capacitor having a first terminal connected to the base of said transistor and a second terminal connected to ground, a first source of constant current for charging said capacitor, and second switching means for controlling the application of said charging current to said capacitor, whereby the conduction state of said transistor is reversed when the potential on said capacitor reaches a first threshold level, the improvement characterized by:

(a) third switching means for controlling said first constant current source, comprising:
   means for providing a second threshold level lower than said first threshold level;
   means connected between the means for providing the second threshold level and said capacitor for comparing the potential on said capacitor with the second threshold level; and
   means actuated by the comparing means for increasing the magnitude of said charging current when the charge on said capacitor reaches said second threshold level.

2. A switching circuit as defined in claim 1, wherein said at least one transistor of said first switching means comprises a first pair of differentially connected transistors, said second switching means comprises a transistor having its emitter-collector path connected between the first terminal of said capacitor and ground and a switching signal input terminal connected to its base, and said first constant current source comprises a resistor having one end connected to a supply voltage source, a transistor having its emitter-collector path connected between the other end of said resistor and said capacitor, and diode biasing means connected between said supply voltage source and the base of said latter transistor.

3. A switching circuit as defined in claim 2, wherein said means for increasing the magnitude of said charging current comprises a shunting transistor having its emitter-collector path connected between said supply voltage source and an intermediate point of said resistor which is rendered conductive by said comparing means when the potential on said capacitor reaches said second threshold level.

4. A switching circuit as defined in claim 2, wherein said means for providing the second threshold level comprises a reverse biased Zener diode and said comparing means comprises a further transistor having its emitter-collector path connected to said supply voltage source and to ground through the Zener diode and its base connected to said capacitor.

5. A switching circuit as defined in claim 2, wherein said comparing means and said means for increasing the magnitude of said charging current comprise a second pair of differentially connected transistors having "on" or "off" conductive states and having common terminals connected to a second constant current source, a terminal connected to the second terminal of said capacitor, a terminal connected to said means for providing the second threshold level and a terminal connected to said first constant current source, whereby the conductive states of said second pair of transistors are reversed when the potential on said capacitor reaches said second threshold level.

* * * * *